United States Patent
Mandigo et al.

(10) Patent No.: US 8,430,979 B2
(45) Date of Patent: *Apr. 30, 2013

(54) COPPER ALLOY CONTAINING COBALT, NICKEL AND SILICON

(75) Inventors: Frank N. Mandigo, North Branford, CT (US); Peter W. Robinson, Glen Carbon, IL (US); Derek E. Tyler, Cheshire, CT (US); Andreas Boegel, Weissenhorn (DE); Hans-Achim Kuhn, Illertissen (DE); Frank M. Keppeler, Stuttgart (DE); Joerg Seeger, Ulm (DE)

(73) Assignee: GBC Metals, LLC, East Alton, IL (US)

( * ) Notice: Subject to any disclaimer, the term of this patent is extended or adjusted under 35 U.S.C. 154(b) by 728 days.

This patent is subject to a terminal disclaimer.

(21) Appl. No.: 11/588,111

(22) Filed: Oct. 26, 2006

(65) Prior Publication Data

US 2007/0131315 A1 Jun. 14, 2007

Related U.S. Application Data

(63) Continuation of application No. 10/610,433, filed on Jun. 30, 2003, now Pat. No. 7,182,823, and a continuation of application No. 11/246,966, filed on Oct. 7, 2005, now Pat. No. 8,257,515.

(60) Provisional application No. 60/393,765, filed on Jul. 5, 2002.

(51) Int. Cl.
 *C22C 9/06* (2006.01)

(52) U.S. Cl.
 USPC ........... 148/435; 148/433; 148/434; 148/436; 420/485; 420/486; 420/487; 420/488

(58) Field of Classification Search ............... 148/433, 148/434, 436, 432, 435; 420/485, 486, 487, 420/488
See application file for complete search history.

(56) References Cited

U.S. PATENT DOCUMENTS

| | | | |
|---|---|---|---|
| 2,157,934 A | 5/1939 | Hensel et al. | 148/32 |
| 2,178,992 A | 11/1939 | Hensel et al. | 75/160 |

(Continued)

FOREIGN PATENT DOCUMENTS

| | | |
|---|---|---|
| EP | 0018818 | 11/1980 |
| FR | 2706488 | 12/1994 |

(Continued)

OTHER PUBLICATIONS

Huang, F. et al. "Precipitation in Cu-Ni-Si-Zn Alloy for Lead Frame", Materials Letter 57 (2003) pp. 2135-2139.

(Continued)

*Primary Examiner* — Sikyin Ip
(74) *Attorney, Agent, or Firm* — Harness, Dickey & Pierce, P.L.C.

(57) ABSTRACT

A copper alloy having an improved combination of yield strength and electrical conductivity contains, by weight, from 1% to 2.5% of nickel, from 0.5% to 2.0% of cobalt, with a total nickel plus cobalt content of from 1.7% to 4.3%, from 0.5% to 1.5% of silicon with a ratio of (Ni+Co)/Si of between 3.5 and 6, and the balance copper and inevitable impurities wherein the wrought copper alloy has an electrical conductivity in excess of 40% IACS. A further increase in the combination of yield strength and electrical conductivity as well as enhanced resistance to stress relaxation is obtained by a further inclusion of up to 1% of silver.

10 Claims, 7 Drawing Sheets

U.S. PATENT DOCUMENTS

| | | | |
|---|---|---|---|
| 4,191,601 A | 3/1980 | Edens et al. | 148/160 |
| 4,260,435 A | 4/1981 | Edens et al. | 148/32.5 |
| 4,594,221 A | 6/1986 | Caron et al. | 420/485 |
| 4,687,633 A | 8/1987 | Miyafuji et al. | 420/481 |
| 4,692,192 A | 9/1987 | Ikushima et al. | 148/12.7 |
| 4,728,372 A | 3/1988 | Caron et al. | 148/2 |
| 4,792,365 A | 12/1988 | Matsui et al. | 148/12.7 |
| 5,028,391 A | 7/1991 | Ingerson | 420/488 |
| 5,124,124 A | 6/1992 | Ohashi et al. | 420/473 |
| 5,147,469 A | 9/1992 | Kanzaki et al. | 148/684 |
| 5,846,346 A | 12/1998 | Lee et al. | 148/433 |
| 6,334,915 B1 | 1/2002 | Ogura et al. | 148/435 |
| 6,506,269 B2 | 1/2003 | Liu et al. | 148/554 |
| 6,558,617 B2 | 5/2003 | Miwa | 420/418 |
| 6,641,930 B2 | 11/2003 | Schleicher et al. | 428/647 |
| 2002/0029827 A1 | 3/2002 | Liu et al. | 148/554 |

FOREIGN PATENT DOCUMENTS

| | | |
|---|---|---|
| GB | 1358055 | 6/1974 |
| JP | 59(1984)-145746 | 8/1984 |
| JP | 59(1984)-145749 | 8/1984 |
| JP | 63-109134 | 5/1988 |
| JP | 63105943 | 5/1988 |
| JP | 3(1991)-4613 | 1/1991 |
| JP | 3-162553 | 7/1991 |
| JP | 05179377 | 7/1993 |
| JP | 05-222467 | 8/1993 |
| JP | 06-184681 | 7/1994 |
| JP | 07-018356 | 1/1995 |
| JP | 07-090520 | 4/1995 |
| JP | 07090520 | 4/1995 |
| JP | 09-020943 | 1/1997 |
| JP | 09-227971 | 9/1997 |
| JP | 10296398 | 11/1998 |
| JP | 11-036055 | 2/1999 |
| JP | 11(1999)-222641 | 8/1999 |
| JP | 11222641 | 8/1999 |

OTHER PUBLICATIONS

Chinese Patent Office Rejection Decision Corresponding Chinese Patent Application No. 200710089098.2 Date: Jan. 8, 2010 pp. 7.

COPPER ALLOY CONTAINING COBALT, NICKEL AND SILICON

CROSS-REFERENCE TO RELATED PATENT APPLICATION

This patent application claims priority to U.S. patent application Ser. No. 10/610,433, filed Jun. 30, 2003, now U.S. Pat. No. 7,182,823, and U.S. patent application Ser. No. 11/246,966, filed Oct. 7, 2005, now U.S. Pat. No. 8,257,515, both of which claim priority to U.S. Provisional Patent Application Ser. No. 60/393,765 filed Jul. 5, 2002. The subject matter of all of which are incorporated by reference in their entireties.

BACKGROUND OF THE INVENTION

1. Field of the Invention

The present invention relates to copper alloys and to a method for the manufacture of such alloys. In particular, in a first embodiment, this invention relates to a copper alloy with controlled additions of cobalt, nickel and silicon. In a second embodiment, the invention relates to a copper alloy with controlled additions of cobalt, nickel, silicon and silver. The alloys of the invention are particularly suited to be formed into electrical connectors, lead frames and other electric current carrying components.

A third embodiment of the invention is drawn to a method to process both the alloys of the invention and other copper alloys that contain nickel and silicon. More particularly, this process includes hot working a copper-nickel-silicon alloy followed by multiple annealing steps.

2. Brief Description of Art

There is a need in the marketplace for metal alloys having a combination of (1) good formability; (2) high strength; (3) moderately high electrical conductivity; and (4) good stress relaxation resistance. This combination of properties is particularly important for parts that are formed into various electrical interconnections for use in under-the-hood automotive connectors, multimedia (e.g. computers and consumer electronics) electrical connectors, terminal applications, foils, wire and powders, as well as other products. A number of commercial copper alloys are available for use in these applications, but lack the required combination of properties.

The first recited property, formability, is typically evaluated by a bend test. A strip of the copper alloy at a specified gauge and temper, is bent 90° around a mandrel of known radius. The minimum bend radius (mbr) as a function of strip thickness (t) is then reported as mbr/t. The minimum bend radius is the smallest radius mandrel about which a strip can be bent without cracks visible at a magnification of 15×. Generally mbr/t is reported for both good way bends, defined as the bend axis is normal to the rolling direction, and for bad way bends, defined as the bend axis is parallel to the rolling direction. An mbr/t of up to 4t for both good way bends and bad way bends is deemed to constitute good formability. More preferred is an mbr/t of up to 2.

The second recited property, moderate electrical conductivity, is typically viewed as an electrical conductivity in excess of 40% IACS. More preferably, the electrical conductivity is in excess of 50% IACS. IACS refers to International Annealed Copper Standard that assigns "pure" copper a conductivity value of 100% IACS at 20° C. Throughout this patent application, all electrical and mechanical testing is performed at room temperature, nominally 20° C., unless otherwise specified. The qualifying expression "about" indicates that exactitude is not required and should be interpreted as ±10% of a recited value.

The third recited property, high strength, is viewed as a yield strength in excess of 95 ksi (655.1 MPa) and preferably in excess of 110 ksi (758.5 MPa). As the gauge of copper formed into components decreases and as miniaturization of these components continues, a combination of strength and conductivity for a given temper will be more important than either strength or conductivity viewed alone.

The fourth recited property, good resistance to stress relaxation, is viewed as at least 70% of an imparted stress remaining after a test sample is exposed to a temperature of 150° C. for 3000 hours and at least 90% of an imparted stress remaining after a test sample is exposed to a temperature of 105° C. for 1000 hours.

Stress relaxation may be measured by a lift-off method as described in ASTM (American Society for Testing and Materials) Standard E328-86. This test measures the reduction in stress in a copper alloy sample held at fixed strain for times up to 3000 hours. The technique consists of constraining the free end of a cantilever beam to a fixed deflection and measuring the load exerted by the beam on the constraint as a function of time at temperature. This is accomplished by securing the cantilever beam test sample in a specially designed test rack. The standard test condition is to load the cantilever beam to 80% of the room temperature 0.2% offset yield strength. If the calculated deflection exceeds about 0.2 inch, the initial stress is reduced until the deflection is less than 0.2 inch and the load is recalculated. The test procedure is to load the cantilever beam to the calculated load value, adjust a threaded screw in the test rack to maintain the deflection, and locking the threaded screw in place with a nut. The load required to lift the cantilever beam from the threaded screw is the initial load. The test rack is placed in a furnace set to a desired test temperature. The test rack is periodically removed, allowed to cool to room temperature, and the load required to lift the cantilever beam from the threaded screw is measured. The percent stress remaining at the selected log times is calculated and the data are plotted on semi-log graph paper with stress remaining on the ordinate (vertical) and log time on the abscissa (horizontal). A straight line is fitted through the data using a linear regression technique. Interpolation and extrapolation are used to produce stress remaining values at 1, 1000, 3000, and 100,000 hours.

The resistance to stress relaxation is orientation sensitive and may be reported in the longitudinal (L) direction where 0° testing is conducted with the long dimension of the test sample in the direction of strip rolling and the deflection of the test sample is parallel to the strip rolling direction. The resistance to stress relaxation may be reported in the transverse (T) direction where 90° testing is conducted with the long dimension of the test sample perpendicular to the strip rolling direction and the deflection of the test sample is perpendicular to the strip rolling direction.

One group of commercially available copper alloys commonly used for electrical connectors are copper-nickel-silicon alloys. The alloys are precipitation hardenable and achieve high strength through the presence of nickel silicides as a second phase. One copper-nickel-silicon alloy, designated copper alloy C7025 has a composition of 2.2%-4.2% nickel, 0.25%-1.2% silicon, 0.05%-0.30% magnesium and the balance copper. Alloy designations are in accordance with the Copper Development Association (CDA) or New York, N.Y. Copper alloy C7025 is disclosed in more detail in U.S. Pat. Nos. 4,594,221 and 4,728,372 that are incorporated by reference in their entireties herein.

U.S. Pat. No. 6,506,269 discloses copper alloys having controlled additions of nickel, cobalt, silicon and either magnesium or phosphorous. The patent discloses processing the copper alloy by either a high temperature approach or a low temperature approach. The high temperature approach yields properties that fall short of the target combination of strength and conductivity recited above. When processed by the high temperature approach, Exemplary Alloy 1 is reported to have an electrical conductivity of 51.9% IACS and a tensile strength of 709 MPa (102.9 ksi). When processed by the low temperature approach, Exemplary Alloy 1 is reported to have an electrical conductivity of 51.5% IACS and a tensile strength of 905 MPa (131.3 ksi). However the low temperature approach imparts excessive cold working into the copper alloy which is expected to result in poor formability and poor resistance to stress relaxation. U.S. Pat. No. 6,506,269 is incorporated by reference in its entirety herein.

Copper alloy C7027 has a composition of 0.28%-1.0% iron, 1.0%-3.0% nickel, 0.10%-1.0% tin, 0.20%-1.0% silicon and the balance copper. Copper alloy C7027 is disclosed in more detail in U.S. Pat. No. 6,251,199 that is incorporated by reference in its entirety herein.

Japanese Kokai Hei 11(1999)-222,641 discloses copper alloys having controlled additions of nickel, silicon, magnesium and tin. Optional additions include cobalt and silver.

The electrical and mechanical properties of precipitation hardenable copper alloys are strongly influenced by the method of manufacture of the copper alloy. One process for a copper-nickel-silicon-indium-tin alloy is disclosed in U.S. Pat. No. 5,124,124 and includes the processing sequence of continuous cast, solutionize, quench, cold roll, precipitation anneal.

A different process for a copper-cobalt-phosphorous alloy that may optionally contain up to 0.5% in combination of nickel and silicon is disclosed in U.S. Pat. No. 5,147,469. This process includes the process steps of cast, hot roll, quench, cold roll, solutionize, quench, precipitation anneal, quench, cold roll, anneal and quench.

The U.S. Pat. Nos. 5,124,124 and 5,147,469 patents are both incorporated by reference in their entireties herein.

There remains a need for copper alloys and processes to manufacture those copper alloys to have an improved combination of properties for meeting the needs the automotive and multimedia industries, as well as others where miniaturization is causing more stringent strength and conductivity requirements to be imposed.

BRIEF SUMMARY OF THE INVENTION

A first aspect of the present invention is directed to a wrought copper alloy that consists essentially of, by weight, from 1% to 2.5% of nickel, from 0.5% to 2.0% of cobalt, with a total nickel plus cobalt content of from 1.7% to 4.3%, from 0.5% to 1.5% of silicon with a ratio of (Ni+Co):Si of between 2:1 and 7:1, and the balance copper and inevitable impurities. This wrought copper alloy has an electrical conductivity in excess of 40% IACS.

A second aspect of the invention is drawn to the above wrought copper alloy with a further inclusion of up to 1% of silver, titanium, zirconium and mixtures thereof.

A third aspect of the invention is directed to a process for the manufacture of a copper base alloy having a combination of high electrical conductivity, high strength and good formability. The process includes the sequential steps of (a). casting the copper-base alloy; (b). hot working the cast copper-base alloy to effect a first reduction in cross-sectional area; (c). solutionizing the cast copper-base alloy at a temperature and for a time effective to substantially form a single phase alloy; (d). without any intervening cold work following solutionizing, first age annealing the single phase alloy at a temperature and for a time effective to precipitate an amount of a second phase effective to form a multi-phase alloy having silicides; (e). cold working the multi-phase alloy to effect a second reduction in cross-sectional area; and (f). second age annealing the multiphase alloy at a temperature and for a time effective to increase the volume fraction of particles precipitated thereby raising conductivity, wherein the second age annealing temperature is less than the first age annealing temperature. This process is amenable to the copper alloys of the first and second aspects of the invention as well as selected other copper alloys.

Yet another aspect of the present invention is directed to a second copper alloy that is amenable to processing by the above-stated process. This copper alloy is suitable for forming into an electrical connector and consists essentially of, by weight, from 1% to 2.5% of nickel, from 0.5% to 2.0% of cobalt, with a total nickel plus cobalt content of from 1.7% to 4.3%, from 0.5% to 1.5% of silicon with a ratio of (Ni+Co):Si being between 2:1 and 7:1, from an effective amount to improve a combination of yield strength and electrical conductivity to 1.0% of silver, titanium, zirconium and mixtures thereof, up to 0.15% of magnesium and the balance is copper and inevitable impurities wherein the wrought copper alloy has an electrical conductivity in excess of 40% IACS.

DETAILED DESCRIPTION OF THE INVENTION

Figure 1:
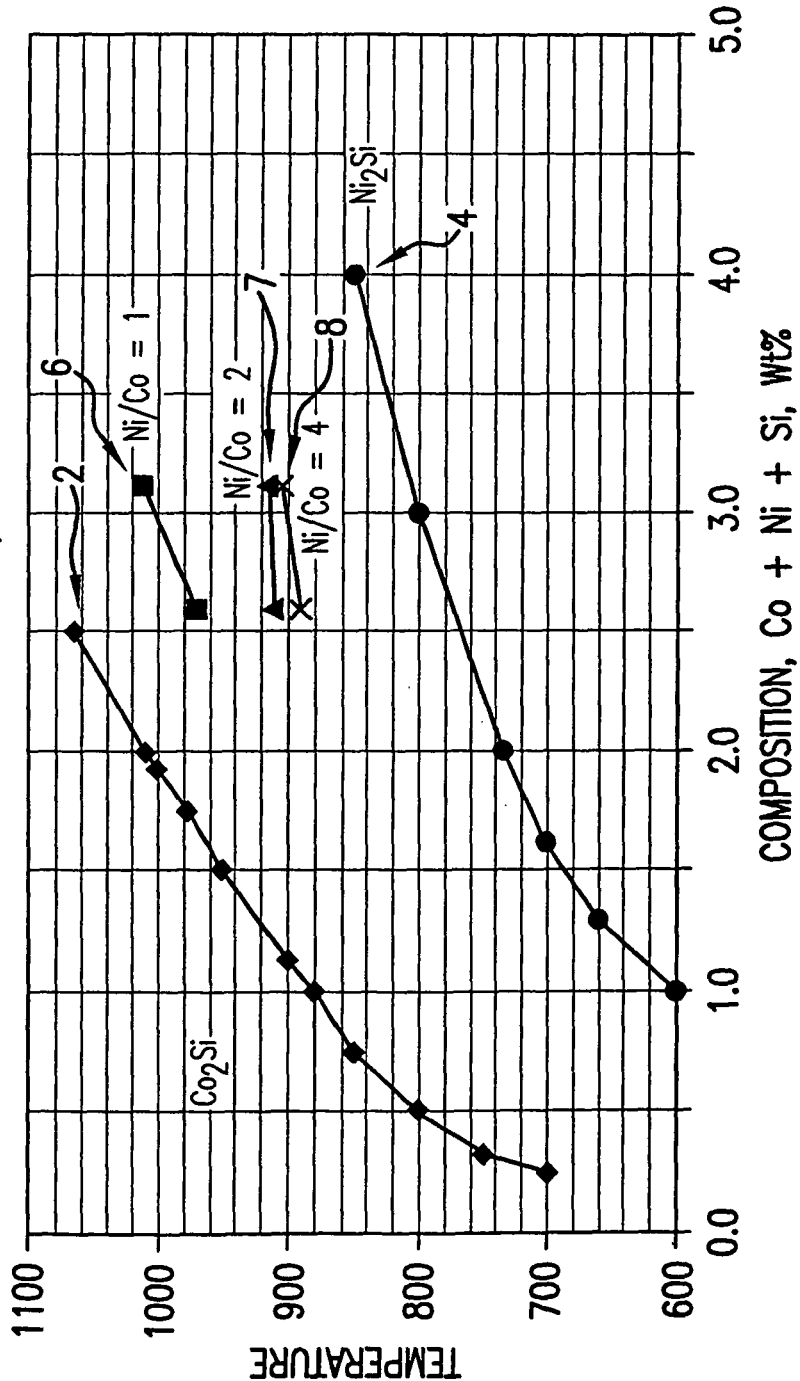
FIG. 1 graphically illustrates solvus temperature as a function of nickel to cobalt weight ratio.

In accordance with a first embodiment of the invention, the copper alloy of the invention is a wrought alloy that contains controlled amounts of nickel, cobalt and silicon and a controlled ratio of nickel to cobalt. Further, the impurity levels, particularly of zinc, chromium, magnesium, tin and phosphorous are controlled. The copper alloy has an electrical conductivity in excess of 40% IACS and is suitable for forming into an electrical connector for applications such as automotive and multimedia.

Nickel and Cobalt

Nickel and cobalt combine with silicon to form silicides that are effective for age hardening, to restrict grain growth and to increase softening resistance. The nickel is present in an amount of from 1% to 2.5%. When the nickel content is less than 1%, the alloy has insufficient strength. When the nickel content exceeds 2.5%, conductivity and hot working capability are reduced. In a preferred embodiment, the nickel content is from 1.3% to 1.9% and in a most preferred embodiment, the nickel content is from 1.3% to 1.5%.

The cobalt is present in an amount of from 0.5% to 2.5%. When the cobalt content is less than 0.5%, there is insufficient precipitation of a cobalt-containing silicide second phase. In addition, when there is a minimum cobalt content of 0.5% combined with a minimum silicon content of 0.5%, the grain size of the alloy after solutionizing is maintained at 20 microns or less. When the cobalt content exceeds 2.5%, excessive second phase particles precipitate leading to a reduction in formability and the copper alloy may be imparted with undesirable ferromagnetic properties. Preferably, the cobalt content is between about 0.5% and about 1.5% and in a most preferred embodiment, the cobalt content is from about 0.7% to about 1.2%.

During precipitation aging, a cobalt content of 1.0% or higher is believed to suppress cellular precipitation in favor of continuous precipitation. Cellular precipitation forms an irregular array of parallel Cu-rich and $Ni_2Si$ lamellae forming behind a moving grain boundary during an aging treatment. The silicide lamellae are usually too large to provide effective age hardening and the copper component is recrystallized or softened. More preferred is continuous precipitation that provides sub-micron coherent/semi-coherent particles that contribute to a strong age hardening response.

The sum of the combination of nickel and cobalt is maintained between 1.7 and 4.3 weight percent. Preferably, the sum is from 2 to 4 weight percent and most preferably, the sum is between 2.3 and 2.7 weight percent. Outside these ranges, it is difficult to process the alloy to achieve the desired combination of properties.

The nickel to cobalt weight ratio is maintained between (Ni:Co)=0.5:1 and 5:1 to achieve the desired combination of properties. Preferably, there is a small excess of nickel and the nickel to cobalt with the weight ratio being between 1.01:1 and 2.6:1 and most preferably, the nickel to cobalt weight ratio is between 1.05:1 and 1.5:1.

The interaction of nickel and cobalt in a copper alloy that contains silicon is demonstrated with reference to FIG. 1, during solutionizing, it is difficult to dissolve large amounts of cobalt silicide into copper because the solvus temperatures of a copper-cobalt-silicon alloy is relatively high, greater than 1050° C. when cobalt+silicon equals 2.5% (reference point 2). Similarly, the solvus temperature of a copper-nickel-silicon alloy is also relatively high, greater than 850° C. when nickel+silicon equals 4.0% (reference point 4). When a mixture of nickel and cobalt is present, the nickel to cobalt ratio impacts the solvus. When the amount of cobalt+nickel+silicon equals 3.0%, the solvus is about 1000° C. when the nickel to cobalt weight ratio is 1:1 (reference point 6). The solvus is about 915° C. when the nickel to cobalt weight ratio is 2:1 (reference point 7) and the solvus about 905° C. when the nickel to cobalt weight ratio is 4:1 (reference point 8). Compositions with a lower solvus facilitate solid state dissolution of cobalt, nickel and silicon into copper.

After the alloy has been processed as described below whereby second phase silicides are caused to precipitate, electron microscopy analysis of approximately 200 Å diameter second phase particles indicates that nickel substitutes directly for cobalt; with nickel to cobalt ratios in the second phase particles at a ratio that approximates that in the bulk alloy.

Silicon

Silicon is effective to increase strength by the formation of second phase silicides when in the presence of silicide formers such as nickel and cobalt. When the silicon content is less than 0.5%, an insufficient volume fraction of precipitate forms to increase strength and it is difficult to control the solutionized grain size. When the silicon content exceeds 1.5%, an excessive number of coarse particles form. Preferably, the silicon content is from 0.5% to 0.8% and most preferably, from 0.55% to 0.65%.

The electrical conductivities of the copper alloy of the invention are highest when the weight ratio of (Ni+Co):Si ratio is between 2:1 and 7:1. More preferably, the (Ni+Co):Si weight ratio is between 3:1 and 6:1 and most preferably between 3.5:1 and 6:1. Electrical conductivity is degraded if the alloying elements of nickel, cobalt and silicon are present in the copper alloy in amounts outside those defined by the ratios above.

Silver, Titanium and Zirconium

Small additions, less than 1% in total, of silver, titanium, zirconium and combinations of these alloys improve the yield strength/conductivity combination. Additions of silver also improve the stress relaxation resistance.

In a second embodiment of the invention, the copper alloy further includes up to 1% of silver, titanium, zirconium and combinations thereof. Preferably, from 0.2% to 0.7% of these elements. In preferred embodiments, the addition of one of silver from 0.2% to 0.7%, titanium from 0.15% to 0.3% or zirconium from 0.2% to 0.5%.

Other Elements

The copper alloys of the invention may contain other, unspecified, elements in amounts not effective to materially change a basic property of the alloy and still be within the scope of the claims that follow. In addition, the copper alloys will likely contain certain inevitable impurities. However, impurities levels and unspecified additions are limited as follows.

Zinc—the zinc content is maintained to a maximum of 0.5% and preferably below 0.25%. When the zinc content exceeds this maximum amount, the electrical conductivity decreases. Most preferably the maximum zinc content is less than 0.1%.

Chromium—the chromium content is maintained to a maximum of 0.08%. When the chromium content exceeds this maximum amount, the likelihood of forming coarse chromium-containing silicides increases. Preferably, the chromium content is less than 0.02%.

Tin—the tin content is maintained to a maximum of 0.3% and preferably less than 0.04%. When the tin content exceeds this maximum amount, the electrical conductivity decreases. Most preferably, the tin content is less than 0.02%.

Phosphorous—the phosphorous content is preferably less than 0.04%. When the phosphorous exceeds this level, cobalt phosphides and nickel phosphides may precipitate reducing the amount of cobalt and nickel available for silicide formation. Preferably, the phosphorous content is less than 0.02%.

A small, but effective, amount of an element for deoxidation, desulfurization and decarburization may also be present. Typically these elements will be present in an amount of less than 0.15% and preferably in an amount of from 0.005% up to 0.04%. Such elements include magnesium, calcium and misch metal. Magnesium also increases stress relaxation resistance and softening resistance during in-process aging anneal heat treatments and is most preferred.

Other elements, that could be present in an amount of less than 0.1% of any one element and 0.5%, in total, include iron, manganese, aluminum, lead, bismuth, sulfur, tellurium, selenium, beryllium, arsenic, antimony, and boron.

While this disclosure is particularly drawn to a process for the manufacture of copper alloy strip, the alloys of the invention and the processes of the invention are equally amenable to the manufacture of other copper alloy products, such as foil, wire, bar and tube. In addition, processes other than conventional casting, such as strip casting, powder metallurgy and spray casting are also within the scope of the invention.

Figure 2:
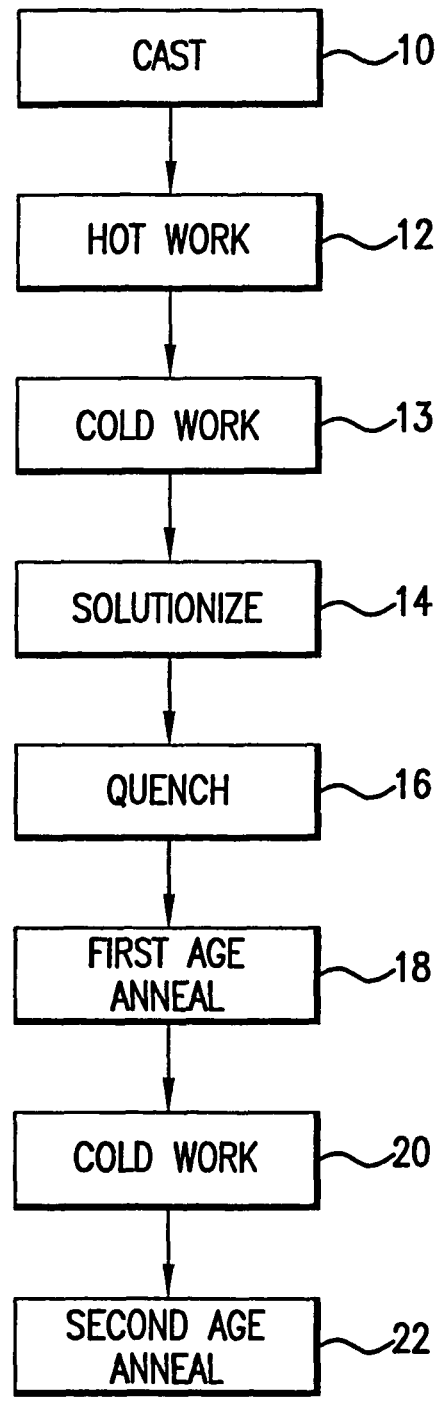
FIG. 2 shows in flow chart representation a first process for the manufacture of the alloys of the invention and other copper-nickel-silicon containing alloys.

With reference to FIG. 2, in accordance with a third embodiment of the invention, the copper alloy is formed into strip or other useful form. A mixture of the alloying components in the proper proportions are added to molten copper. The molten metal is poured into a mold suitable for direct chill (DC) casting and cast 10 to form an ingot. Other processes, such as spray casting, thin strip casting and continuous or semi-continuous casting may be used to present the alloy in a form suitable for hot rolling 12 or cold rolling.

The alloy is hot worked 12 at a temperature of between 750° C. and 1,050° C. A preferred hot working temperature is between 850° C. and 1000° C. For strip, hot working typically is hot rolling, while for rod and wire, extrusion may be employed. Following hot working the alloy is typically cold worked 13 to a convenient gauge for solutionizing. When in strip form, an exemplary thickness for solutionizing is between about 0.002 inch and about 0.10 inch. The surface may be conditioned, such as by milling or brushing, to obtain desired surface characteristics.

The copper alloy is then solution annealed 14 at a first temperature and a first time, the combination of temperature and time being effective to substantially form a single phase alloy. A suitable solutionizing temperature is between about 750° C. and about 1,050° C. and a suitable time is from about 10 seconds to about one hour in a neutral or reducing atmosphere. Generally, the more nickel present, the lower the solutionizing temperature to reduce the formation of coarse grains, see Reference Line 4 of FIG. 1. The more cobalt present, the higher the solutionizing temperature to promote solid state dissolution, see Reference Line 2 of FIG. 1. Referring back to FIG. 2, for strip, a preferred solution anneal 14 is at a temperature of between about 800° C. and about 1000° C. for a time of between about 10 seconds and about 5 minutes. A most preferred solutionizing temperature is between 900° C. and 975° C.

The solution anneal 14 is followed by a quench or rapid cool 16 to ambient temperature (ambient is nominally 20° C.). Preferably the cooling rate is in excess of 100° C. per minute. Following the quench or rapid cool, the copper alloy has an electrical conductivity of less than about 25% IACS (14.5 MS/m) and an equiaxed grain size that is preferably between about 5 and 20 μm.

The sequence of solution anneal followed by quench may be repeated multiple times, typically, an optional cold roll step is inserted between such anneals. The multiple sequence may lead to a more uniform particle distribution and texture. Generally, the temperature of each solution anneal except the last one may be anywhere within the broadly defined range above. The final solution anneal temperature controls the grain size and is therefore more precisely selected to achieve a preferred grain size and/or to achieve a controlled volume fraction of second phase particulate with a preferred diameter.

Following the quench 16, the copper alloy is subjected to first anneal 18 at a temperature and for a time effective to precipitate an amount of second phase effective to form a multiphase alloy having silicides. For strip, an exemplary first anneal is at a temperature of between about 350° C. and about 600° C. for a time of from 30 minutes to 30 hours in a neutral or reducing atmosphere. More preferably, the first anneal 18 is at a temperature of between about 475° C. and about 550° C. for a time of from about 30 minutes to about 24 hours. A most preferred temperature range for the first age anneal is from 490° C. to 530° C. An optimum combination of electrical properties, mechanical properties, formability and resistance to stress relaxation is achieved in the final product when the first anneal 18 immediately follows the solutionize→quench sequence, without any intervening cold working.

An alternative process of the invention includes a cold roll step between the quench and first age anneal, subject to the caveat that the second age temperature is less than the first age temperature.

Any of the anneals disclosed herein may be a step anneal process. Typically, in a step anneal, the first step will be at a higher temperature than the second step. Step anneals may result in better combinations of strength and conductivity than a constant temperature anneal. The alloy is then cold worked 20 to a 5% to 50% reduction in thickness and subjected to a second anneal 22 at a temperature and time effective to increase conductivity. Preferably, the second anneal 22 temperature is less than the first anneal 18 temperature. For strip, an exemplary second anneal temperature is from about 350° C. to about 600° C. for a time of from about 10 seconds to 30 hours in a neutral or reducing atmosphere. More preferably, the second anneal 26 is at a temperature of between about 350° C. and about 500° C. for a time of from about one hour to about 24 hours. The sequence of cold work 20 followed by second anneal 22 may be repeated multiple times until the desired gauge and properties are achieved.

While the above process is particularly suited for the copper alloys of the invention, the process is also amenable to other precipitation hardening copper alloys. In particular copper-M-silicon alloys where M is a silicide former that is preferably nickel, cobalt or a mixture thereof, such as those containing from 0.5% to 5% of M and 0.2% to 1.5% of silicon may benefit from the process.

Another copper-base alloy system believed to also benefit from the process of the invention is Cu—X—Ti where X is a titanate former. Preferred compositions contain 0.35% to 5% of titanium and 0.001% to 5% X, where X is selected from Ni, Fe, Sn, P, Al, Zn, Si, Pb, Be, Mn, Mg, Bi, S, Te, Se, Ag, As, Sb, Zr, B, Cr and Co and combinations thereof and the balance copper and inevitable impurities. In a preferred embodiment, this alloy contains 0.5% to 5% nickel and 0.35% to 2.5% of titanium as disclosed in copending U.S. provisional patent application Ser. No. 60/410,592 that was filed Sep. 13, 2002.

Figure 3:
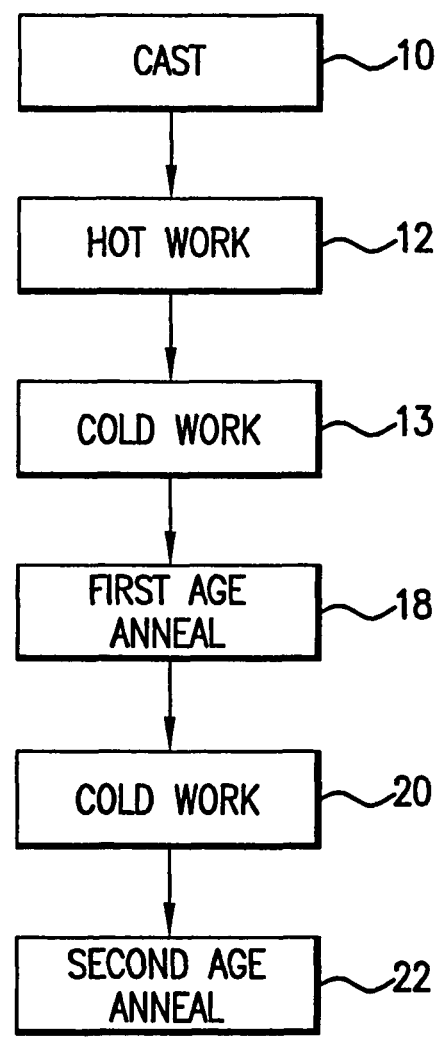
FIG. 3 shows in flow chart representation an alternative process for the manufacture of the alloys of the invention.

In accordance with an alternative process, as illustrated in FIG. 3, the copper alloy can be processed to finish gauge without using an in-process solutionizing heat treatment. The steps of casting 10, hot rolling 12 and first cold working 13 are as above. After first cold work 13, the alloy is subjected to a first aging anneal 18 at a temperature of between about 350° C. and about 600° C. for a time of from about 30 minutes to about 30 hours in a neutral or reducing atmosphere. More preferably, the first aging anneal 18 is at a temperature of from about 450° C. to about 575° C. for a time of between about 30 minutes and about 24 hours. As with the above process, the age anneals may be in a step-wise fashion.

The first aging anneal 18 is followed by a second cold work step 20 that preferably reduces the thickness of the copper alloy by from about 10% to about 50% in thickness and is more preferably from 15% to 30%. The second cold work step is followed by a second aging anneal 22 that is at a lower temperature than the first aging anneal, such as between about 350° C. and about 500° C. for a time of between about 10 seconds and about 30 hours in a neutral or reducing atmosphere. More preferably, the second aging anneal 22 is at a temperature of between about 375° C. and about 475° C. for a time of between about one hour and about 24 hours. A most preferred temperature range for the second age anneal is from 400° C. to 450° C.

The steps of second cold work 20 followed by second aging anneal 22 may be repeated multiple times until the copper alloy strip is at final gauge. This alternative process is especially good for making a product at higher electrical conductivity.

Figure 4:
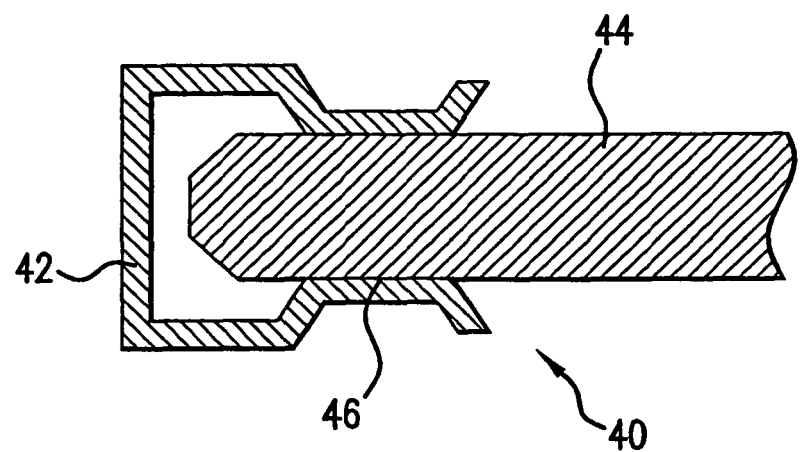
FIG. 4 shows in cross-sectional representation an electrical connector assembly manufactured from the copper alloys of the invention.

The alloys of the invention as well as other copper-nickel (and/or cobalt)-silicon alloys made in accordance with the process of the invention are particularly suited for the manufacture of electrical and electronic connector assemblies of the type illustrated in FIG. 4. This connector assembly 40 utilizes the copper alloys of the invention and other copper alloys processed according to the process of the invention. The connector assembly 40 includes a socket 42 and a plug or jack 44. The socket 42 is formed from a strip of copper alloy and bent into a desired shape, typically with a flat 46 for contacting the plug 44. Consistent contact with the plug 44 is maintained by the stress generated in the alloy strip by displacement of flats 46 caused by insertion of the plug 44. When the connector assembly 40 is exposed to elevated temperatures, and more notably when the temperature is in excess of 100° C., this internal stress gradually dissipates (stress relaxation) and contact between the flats 46 and the plug 44 deteriorates. The alloys of the invention and other copper alloys processed according to the invention better resist elevated temperature stress relaxation and produce an improved electrical connector.

The invention is further described in detail by means of the following Examples

EXAMPLES

Copper alloys having the compositions, in weight percent, listed in Table 1 were prepared as either production bars (identified with the prefix "RN") by direct chill (DC) casting into 6 inch×30 inch×25 foot bars or cast as 10 pound laboratory ingots (identified with the prefix "J"). Unless otherwise indicated in the Examples, production bars were processed to mill plate by soaking at about 900° C. and hot rolling to 0.6 inch. The hot rolled coil was soaked at about 600° C. for from about 5 to 15 hours and then milled to remove surface oxides developed during hot rolling.

Unless otherwise indicated in the Examples, laboratory ingots were processed to mill plate by melting in a silica crucible and casting the molten metal into steel molds. After gating, the ingots were 4 inch×4 inch×1.75 inch. The ingots were soaked for about 3 hours at about 900° C. and hot rolled to 1.1 inch. The hot rolled plate was reheated to about 900° C. and further hot rolled to about 0.5 inch. The 0.5 inch plate was reheated to about 900° C. and held at temperature for 5 minutes and then water quenched. The quenched plates were then soaked at about 600° C. for from about 5 to 15 hours, trimmed and then milled to remove surface oxides developed during hot rolling.

TABLE 1

| Ingot ID | Cobalt | Silicon | Magnesium | Nickel | Ni:Co | (Ni + Co)/Si |
|---|---|---|---|---|---|---|
| J394 | 0.89 | 0.41 | 0.05 | 1.46 | 1.64 | 5.73 |
| J395 | 0 | 0.62 | 0.08 | 2.72 | X | 4.39 |
| J401 | 1.06 | 0.62 | 0.08 | 1.67 | 1.67 | 4.40 |
| J620 | 2.26 | 1.02 | 0.11 | 2.39 | 1.06 | 4.56 |
| J623 | 1.06 | 0.49 | 0.11 | 1.53 | 1.44 | 5.29 |
| J624 | 1.59 | 0.78 | 0.11 | 2.32 | 1.45 | 5.01 |
| J658 | 0.58 | 0.60 | 0.09 | 2.00 | 3.45 | 4.30 |
| J659 | 1.04 | 0.60 | 0.09 | 1.45 | 1.39 | 4.15 |
| J660 | 1.55 | 0.59 | 0.08 | 1.45 | 0.94 | 5.08 |
| J661 | 2.02 | 0.60 | 0.09 | 1.50 | 0.74 | 5.87 |
| J662 | 1.01 | 0.59 | 0.09 | 2.00 | 1.98 | 5.10 |
| J663 | 1.42 | 0.59 | 0.08 | 1.97 | 1.39 | 5.75 |
| J665 | 1.44 | 0.37 | 0.09 | 1.97 | 1.37 | 9.22 |
| J666 | 1.86 | 0.80 | 0.09 | 1.46 | 0.78 | 4.15 |
| J667 | 2.38 | 0.82 | 0.10 | 1.51 | 0.63 | 4.74 |
| J668 | 1.95 | 0.77 | 0.09 | 1.95 | 1.04 | 4.97 |
| J669 | 0.98 | 0.82 | 0.09 | 3.01 | 3.07 | 4.87 |
| J671 | 2.92 | 1.00 | 0.10 | 1.52 | 0.52 | 4.44 |
| J672 | 2.32 | 1.00 | 0.09 | 2.38 | 1.03 | 4.70 |
| J673 | 1.55 | 1.07 | 0.08 | 2.88 | 1.86 | 4.14 |
| J676 | 1.86 | 0.71 | 0.10 | 1.45 | 0.78 | 4.66 |
| J684 | 2.02 | 0.72 | 0.10 | 1.53 + 0.23 Ti | 0.76 | 4.93 |
| J686 | 1.92 | 0.71 | 0.11 | 1.50 + 0.28 Ag | 0.78 | 4.82 |
| J687 | 1.82 | 0.69 | 0.11 | 1.46 + 0.14 Zr | 0.80 | 4.75 |
| J716 | 1.73 | 0.74 | 0.10 | 1.72 | 0.99 | 4.60 |
| J717 | 1.13 | 0.72 | 0.08 | 2.41 | 2.13 | 4.92 |
| J718 | 0.51 | 0.73 | 0.09 | 3.08 | 6.04 | 4.92 |
| J719 | 2.67 | 0.73 | 0.09 | 0 | 0 | 3.65 |
| J720 | 1.83 | 0.73 | 0.09 | 0.96 | 0.52 | 3.82 |
| J721 | 1.37 | 0.73 | 0.09 | 1.45 | 1.06 | 3.86 |
| J722 | 0.89 | 0.73 | 0.09 | 1.93 | 2.17 | 3.86 |
| J723 | 0.55 | 0.70 | 0.10 | 2.27 | 4.13 | 4.03 |
| J724 | 0 | 0.69 | 0.07 | 2.82 | X | 4.09 |
| J727 | 0.43 | 0.71 | 0.09 | 1.73 | 4.02 | 3.03 |
| J728 | 0.70 | 0.72 | 0.10 | 1.52 | 2.17 | 3.08 |
| J729 | 0.95 | 0.75 | 0.10 | 1.14 | 1.20 | 2.79 |
| J730 | 0.66 | 0.73 | 0.10 | 0.68 | 1.03 | 1.84 |
| J731 | 0 | 0.49 | 0.10 | 2.44 | X | 4.98 |
| J737 | 1.14 | 0.38 | 0.10 | 0.55 | 0.48 | 4.45 |
| J738 | 1.32 | 0.44 | 0.10 | 0.68 | 0.52 | 4.55 |
| J739 | 1.60 | 0.56 | 0.10 | 0.82 | 0.51 | 4.32 |
| J740 | 2.06 | 0.71 | 0.10 | 0.98 | 0.48 | 4.28 |
| J741 | 2.23 | 0.81 | 0.11 | 1.10 | 0.49 | 4.11 |
| J742 | 2.57 | 0.94 | 0.08 | 1.24 | 0.48 | 4.05 |
| J743 | 2.92 | 1.13 | 0.09 | 1.40 | 0.48 | 3.82 |
| J772 | 4.35 | 1.40 | 0.09 | 1.92 | 0.44 | 4.48 |
| J824 | 1.80 | 0.60 | 0.12 | 0.77 | 0.43 | 4.28 |
| J834 | 1.77 | 0.60 | 0 | 0.76 + 0.20 Ag | 0.43 | 4.22 |
| J835 | 1.88 | 0.64 | 0 | 0.75 | 0.40 | 4.11 |
| J836 | 1.86 | 0.63 | 0.10 | 0.75 + 0.21 Ag | 0.40 | 4.14 |
| J910 | 0.64 | 0.56 | 0.09 | 1.79 | 2.80 | 3.86 |
| J954 | 1.17 | 0.60 | 0 | 1.22 + 0.052 Ag | 1.04 | 3.98 |
| J955 | 1.18 | 0.59 | 0 | 1.21 + 0.099 Ag | 1.03 | 4.05 |
| J956 | 1.17 | 0.59 | 0 | 1.22 + 0.19 Ag | 1.04 | 4.05 |
| J969 | 1.04 | 0.61 | 0.001 | 1.37 | 1.32 | 3.95 |
| J970 | 1.05 | 0.62 | 0.01 | 1.37 | 1.30 | 3.90 |
| J971 | 1.04 | 0.62 | 0.021 | 1.38 | 1.33 | 3.90 |
| J972 | 1.05 | 0.63 | 0.033 | 1.38 | 1.31 | 3.86 |
| J973 | 1.05 | 0.62 | 0.044 | 1.39 | 1.32 | 3.94 |
| J981 | 1.05 | 0.63 | 0.016 | 1.40 + 0.053 Ag | 1.33 | 3.78 |
| J982 | 1.06 | 0.62 | 0.025 | 1.39 + 0.099 Ag | 1.31 | 3.95 |

TABLE 1-continued

| Ingot ID | Cobalt | Silicon | Magnesium | Nickel | Ni:Co | (Ni + Co)/Si |
|---|---|---|---|---|---|---|
| J983 | 1.07 | 0.63 | 0.023 | 1.40 + 0.195 Ag | 1.31 | 4.05 |
| J984 | 1.06 | 0.63 | 0.017 | 1.39 + 0.39 Ag | 1.31 | 3.89 |
| J989 | 0.66 | 0.61 | 0.08 | 1.83 | 2.77 | 4.08 |
| RN503014 | 1.97 | 0.74 | 0.09 | 1.48 | 0.75 | 4.60 |

Example 1

This example illustrates why the alloys of the invention have silicon and cobalt contents both in excess of 0.5 percent by weight.

Milled plate of the alloys listed in Table 2 was cold rolled to 0.016 inch and solutionized at temperatures from 800° C. to 1,000° C. for 60 seconds followed by a water quench 18. The grain size was measured by optical microscopy and is reported in Table 2. For alloy J724, at solutionizing temperatures of 900° C. and 950° C., the grain size is estimated rather than measured.

TABLE 2

| Ingot ID | Solution Heat Treatment | Average Grain Size (microns) |
|---|---|---|
| Alloys of the Invention | | |
| J401 | 850° C./60 seconds | 6 |
| | 950° C./60 seconds | 16 |
| J667 | 925° C./60 seconds | 5 |
| | 950° C./60 seconds | 5 |
| | 975° C./60 seconds | 5 |
| J671 | 925° C./60 seconds | 5 |
| | 950° C./60 seconds | 5 |
| | 975° C./60 seconds | 5 |
| J719 | 900° C./60 seconds | 7 |
| | 950° C./60 seconds | 8 |
| | 1000° C./60 seconds | 14 |
| J720 | 900° C./60 seconds | 6 |
| | 950° C./60 seconds | 8 |
| | 1000° C./60 seconds | 20 |
| J721 | 900° C./60 seconds | 8 |
| | 950° C./60 seconds | 8 |
| | 1000° C./60 seconds | 30 |
| J722 | 900° C./60 seconds | 9 |
| | 950° C./60 seconds | 13 |
| | 1000° C./60 seconds | 43 |
| J723 | 900° C./60 seconds | 9 |
| | 950° C./60 seconds | 12 |
| | 1000° C./60 seconds | 39 |
| RN503014 | 925° C./60 seconds | 5 |
| | 950° C./60 seconds | 6 |
| | 975° C./60 seconds | 8 |
| Comparative Examples | | |
| J724 Co = 0 | 800° C./60 seconds | 7 |
| | 840° C./60 seconds | 9 |
| | 900° C./60 seconds | 60 |
| | 950° C./60 seconds | 140 |
| | 1000° C./60 seconds | 250 |
| J394 Si = 0.41% | 850° C./60 seconds | 9 |
| | 880° C./60 seconds | 11 |
| | 950° C./60 seconds | 34 |

The data of Table 2 illustrates that a controlled, fine grain size of less than about 20 μm in diameter is achieved at solutionizing temperatures up to 950° C. when the alloys have greater than 0.5% of both cobalt and silicon. This grain size control is not achieved when either the cobalt or the silicon content is less than 0.5%.

Example 2

This example illustrates the effect of maintaining the silicon content in excess of 0.5% and the total amount of nickel and cobalt between 1.7% and 4.3% for a combination of high yield strength and high electrical conductivity.

The milled plates were cold rolled to 0.016 inch and solutionized at 950° C. for 60 seconds followed by a water quench. These alloys were first aged at 525° C. for 3 hours, cold rolled to a thickness reduction of 25% to 0.0120 inch gauge and second aged at 425° C. for 6 hours. The yield strength and electrical conductivity combinations achieved are listed in Table 3 as are 90° good way and bad way bend formability.

TABLE 3

| Alloy | Silicon (weight %) | Nickel + Cobalt (weight %) | Yield Strength (ksi) | Electrical Conductivity (% IACS) | 90° MBR/t GW | 90° MBR/t BW |
|---|---|---|---|---|---|---|
| Alloys of the Invention | | | | | | |
| J739 | 0.56 | 2.42 | 110 | 52.7 | 2.2 | 2.2 |
| J740 | 0.71 | 3.04 | 113 | 52.8 | 2.7 | 2.3 |
| J741 | 0.81 | 3.33 | 116 | 52.5 | 2.2 | 2.5 |
| J742 | 0.94 | 3.81 | 118 | 51.7 | 2.3 | 3.9 |
| J743 | 1.13 | 4.32 | 118 | 51.0 | 3.0 | 3.9 |
| Comparative Examples | | | | | | |
| J737 | 0.38 | 1.69 | 104 | 56.5 | N.D. | N.D. |
| J738 | 0.44 | 2.00 | 108 | 54.1 | 2.0 | 2.3 |
| J772 | 1.40 | 6.27 | 121 | 47.0 | 3.9 | 3.9 |

The Table 3 data illustrates that 50% IACS electrical conductivity is achieved at silicon levels from 0.4% to 1.13% and (Ni+Co) levels from 1.7% to 4.3% when the Ni/Co and (Ni+Co)/Si ratios are fixed at ≈0.5 and 3.8 to 4.6, respectively. The data indicate alloys with greater than about 0.5% Si can reach the combination of 110 ksi and 50% IACS. These data also illustrate that increasing both the silicon and the (Ni+Co) levels within the recited ranges raise the yield strength without a significant change in electrical conductivity.

Example 3

This example illustrates that Ni/Co ratios above 2 provide maximum yield strength while Ni/Co ratios less than 1 provide better electrical conductivity at finish gauge. Milled plates of the alloys listed in Table 4 were cold rolled to 0.016 inch and solutionized at a temperature of between 900° C. and 1000° C. for 60 seconds followed by a water quench. These alloys were first age annealed at 525° C. for 3 hours, cold rolled to a thickness reduction of 25% to 0.0120 inch gauge and then second age annealed at 425° C. for 6 hours.

The mechanical and electrical properties of the alloys at finish gauge are recited in Table 4. The data show a reduced Ni/Co ratio increases electrical conductivity and decreases yield strength. The dependency of both yield strength and electrical conductivity on Ni/Co ratio is unexpected.

TABLE 4

| Alloy | Ni:Co Ratio | Finish Gauge Properties | |
|---|---|---|---|
| | | Yield Strength (ksi) | Electrical Conductivity (% IACS) |
| J719 | 0 | 104.8 | 54.0 |
| J720 | 0.52 | 113.0 | 47.7 |
| J721 | 1.06 | 115.3 | 46.8 |
| J722 | 2.17 | 116.6 | 45.3 |
| J723 | 4.13 | 114.9 | 45.6 |

Example 4

Figure 5:
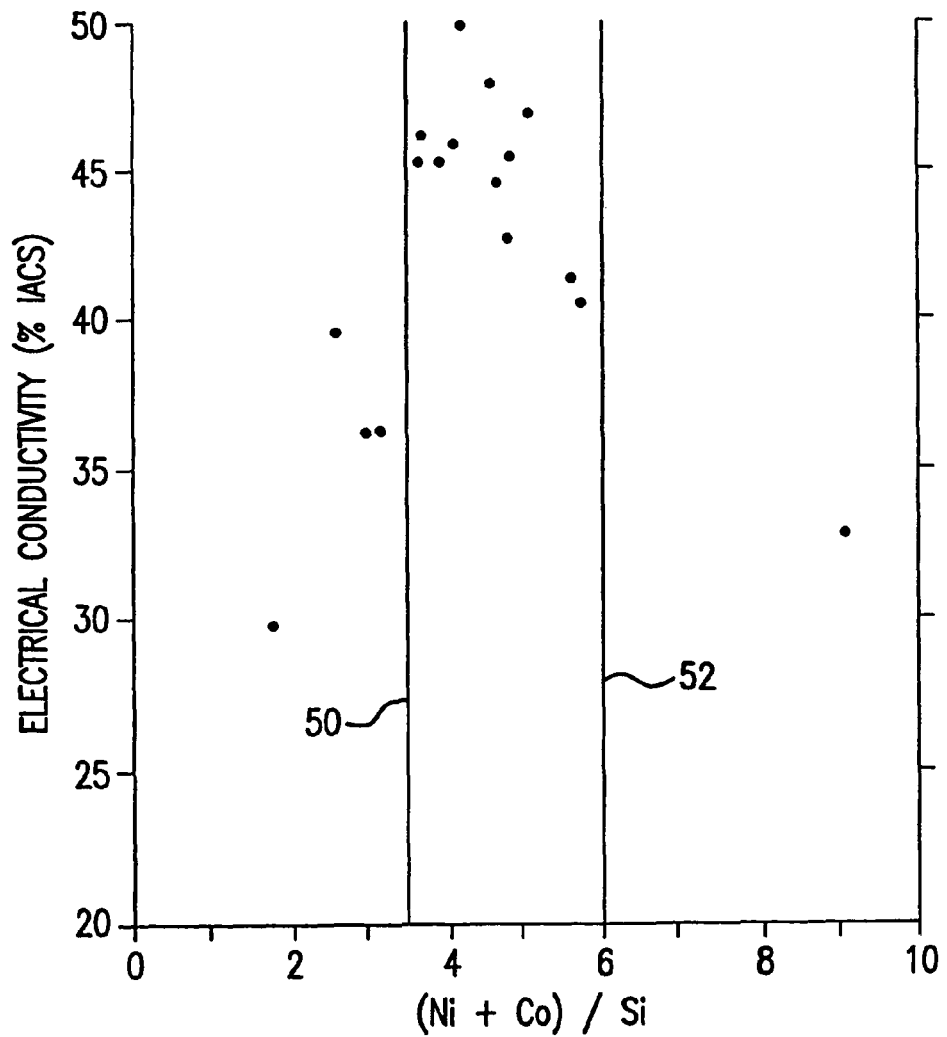
FIG. 5 graphically illustrates that the highest electrical conductivity is achieved when (Ni+Co)/Si is between 3.5 and 6.0.

This example illustrates that the highest combination of yield strength and electrical conductivity is obtained when the (Ni+Co)/Si ratio is between 3.5-6.0. Milled plate of the alloys listed in Table 5 were cold rolled to 0.016 inch and solutionized at 950° C. for 60 seconds followed by a water quench. The alloys were then first aged at 525° C. for 3 hours, cold rolled to a thickness reduction of 25% to 0.0120 inch gauge and then second aged at 425° C. for 6 hours. As shown in Table 5 and FIG. 5, a combination of a yield strength in excess of 110 ksi and an electrical conductivity in excess of 40% IACS is achieved when the (Ni+Co)/Si ratio is between 3.5 (reference line 50 in FIG. 5) and 6.0 (reference line 52 in FIG. 5).

TABLE 5

| Alloy | (Ni + Co)/Si | Finish Gauge Properties | |
|---|---|---|---|
| | | Yield Strength (ksi) | Electrical Conductivity (% IACS) |
| J730 | 1.84 | 94.0 | 29.6 |
| J729 | 2.79 | 106.3 | 38.4 |
| J727 | 3.03 | 102.7 | 36.7 |
| J728 | 3.08 | 107.0 | 36.8 |
| J722 | 3.86 | 116.6 | 45.3 |
| J721 | 3.86 | 115.3 | 46.8 |
| J723 | 4.03 | 114.9 | 45.6 |
| J673 | 4.14 | 123.4 | 45.9 |
| J659 | 4.15 | 114.7 | 49.2 |
| J666 | 4.15 | 116.8 | 49.9 |
| J716 | 4.60 | 116.8 | 47.7 |
| J672 | 4.70 | 117.4 | 44.3 |
| J669 | 4.87 | 123.6 | 43.0 |
| J717 | 4.92 | 120.3 | 45.5 |
| J718 | 4.92 | 123.9 | 45.8 |
| J668 | 4.97 | 117.8 | 46.3 |
| J660 | 5.08 | 112.1 | 47.7 |
| J662 | 5.10 | 117.2 | 47.8 |
| J663 | 5.75 | 114.7 | 41.7 |
| J661 | 5.87 | 108.3 | 40.9 |
| J665 | 9.22 | 97.7 | 33.3 |

Example 5

This example illustrates that small additions of silver, titanium and zirconium increase the combination of yield strength and electrical conductivity. Milled plates of the alloys listed in Table 6 were cold rolled to 0.016 inch and solutionized at a temperature of from 900° to 975° C. for 60 seconds followed by a water quench. These alloys were first aged at 525° C. for 3 hours, cold rolled 24 to a thickness reduction of 25% to 0.0120 inch gauge and then second aged at 425° C. for 6 hours. The yield strength and electrical conductivity at finish gauge are reported in Table 6 and illustrate that dilute alloy additions of silver, titanium and zirconium improve the yield strength/electrical conductivity combinations of the alloys.

TABLE 6

| Alloy | Composition | Solution Anneal Temperature (° C.) | Finish Gauge Properties | |
|---|---|---|---|---|
| | | | Yield Strength (ksi) | Electrical Conductivity (% IACS) |
| J676 | 1.86 - Co<br>1.45 - Ni<br>0.71 - Si<br>0.10 Mg | 900° C.<br>950° C.<br>975° C. | 110<br>113<br>115 | 49.6<br>47.5<br>45.9 |
| J686 | 1.92 - Co<br>1.50 - Ni<br>0.71 - Si<br>0.11 - Mg<br>0.28 - Ag | 900° C.<br>950° C.<br>975° C. | 103<br>114<br>117 | 53.0<br>48.7<br>47.8 |
| J684 | 2.02 - Co<br>1.53 - Ni<br>0.72 - Si<br>0.10 - Mg<br>0.23 - Ti | 900° C.<br>950° C.<br>975° C. | 104<br>115<br>116 | 54.0<br>50.3<br>47.7 |
| J687 | 1.82 - Co<br>1.46 - Ni<br>0.69 - Si<br>0.11 - Mg<br>0.14 - Zr | 900° C.<br>950° C.<br>975° C. | 104<br>115<br>119 | 54.0<br>49.6<br>48.8 |

Milled plates of the alloys listed in Table 7 were cold rolled to 0.016 inch and solutionized at a temperature of 975° C. for 60 seconds followed by a water quench. These alloys were first aged at 525° C. for 3 hours, cold rolled 24 to a thickness reduction of 25% to 0.0120 inch gauge and then second aged at 400° C. for 16 hours. The yield strength and electrical conductivity at finish gauge are reported in Table 7 and confirm that dilute alloy additions of silver improve the yield strength/electrical conductivity combinations of the alloys even when the processing is changed slightly compared to the Table 6 alloys.

TABLE 7

| Alloy | Composition | Solution Anneal Temperature (° C.) | Finish Gauge Properties | |
|---|---|---|---|---|
| | | | Yield Strength (ksi) | Electrical Conductivity (% IACS) |
| J835 | 1.88 - Co<br>0.75 - Ni<br>0.64 - Si | 975° C. | 111 | 54.5 |
| J834 | 1.77 - Co<br>0.76 - Ni<br>0.60 - Si<br>0.20 - Ag | 975° C. | 116 | 53.5 |
| J836 | 1.86 - Co<br>0.75 - Ni<br>0.63 - Si<br>0.21 - Ag<br>0.10 - Mg | 975° C. | 114.5 | 52.8 |

Example 6

This example illustrates how controlled additions of magnesium and/or silver improve the stress relaxation resistance of the alloys of the invention. The example further illustrates that alloys having lower Ni:Co weight ratio (more Co-rich) have better stress resistance relaxation than alloys having a higher Ni:Co weight ration (more Ni-rich). This effect is observed whether or not the alloy further includes silver.

Milled plates of the alloys listed in Table 8 were cold rolled to a thickness of 0.0.16 inch. Alloys J824, J834, J835 and J836 were then solutionized at 975° C. for 60 seconds, first aged at 525° C. for 3 hours, cold rolled to a 25% reduction and then second age annealed at 400° C. for 16 hours.

The other alloys listed in Table 8 were solutionized at 925° C. for 60 seconds, first aged at 500° C. for 8 hours, cold rolled to a 25% reduction and second age annealed at 400° C. for 16 hours.

TABLE 8

| | Percent Stress Remaining After 3000 hours | | | | |
|---|---|---|---|---|---|
| Alloy | 105° C.-L | 150° C.-L | 150° C.-T | 175° C.-L | 200° C.-L |
| J835 | 89.5 | 80.2 | — | 72.4 | 66.2 |
| J824 | 96.3 | 90.0 | — | 82.1 | 78.1 |
| J834 | — | 89.1 | — | — | — |
| J836 | 97.1 | 91.2 | — | 83.5 | 79.4 |
| J969 | 91.3 | 79.5 | 77.1 | 66.9 | 63.2 |
| J970 | 93.1 | 82.9 | 80.4 | 73.9 | 66.4 |
| J971 | 93.8 | 85.0 | 83.7 | 78.7 | 68.4 |
| J972 | 94.3 | 84.8 | 83.8 | 75.9 | 70.7 |
| J973 | 94.1 | 85.8 | 83.3 | 77.0 | 68.1 |
| J981 | 93.9 | 85.8 | 83.4 | 76.7 | 68.4 |
| J954 | 86.3 | 75.7 | — | 66.8 | 56.2 |
| J982 | 95.6 | 87.2 | 85.0 | 77.1 | 70.6 |
| J955 | 88.3 | 76.8 | — | 64.3 | 57.0 |
| J983 | 95.8 | 88.6 | 87.8 | 78.3 | 72.6 |
| J956 | 92.9 | 82.7 | — | 71.0 | 65.1 |
| J984 | 97.3 | 90.0 | 88.7 | 76.3 | 72.0 |

Comparing the stress remaining for alloys J824 (0.12% Mg) and J834 (0.20% Ag) to the stress remaining for alloy J835 (no Mg or Ag) shows that controlled additions of either Mg or Ag improve resistance to stress relaxation. J836 shows that combinations of Mg and Ag also enhance resistance to stress relaxation resistance.

Comparing alloy J956 (0.19% Ag) to alloys J954 and J955 shows that about 0.2% Ag is the minimum effective to significantly improve stress relaxation resistance. Further comparing alloy J981 to alloy J954 or alloy J982 to alloy J955 shows that an addition of magnesium to a silver-containing alloy of the invention further enhances the resistance to stress relaxation.

Comparing alloy J835 (Ni:Co=0.40) to alloy J969 (Ni:Co=1.32) and comparing alloy J834 (Ni:Co=0.43) to alloy J956 (Ni:Co=1.04) shows that the cobalt-rich compositions have better resistance to stress relaxation than the nickel-rich composition, both in the presence of silver and in the absence of silver.

Example 7

This example demonstrates how the process of the invention results in a copper-nickel-silicon alloy with higher electrical conductivity when compared to similar alloys processed by conventional process routes. When the alloy further contains cobalt, this increase in electrical conductivity is accompanied by an increase in yield strength.

Milled plate of the alloys listed in Table 9 was cold rolled to either 0.016 inch or 0.0123 inch and solutionized between 800° C. and 950° C. for 60 seconds followed by a water quench. After solutionizing, in accordance with prior art processing, the quenched alloys were cold rolled either 25% in thickness from 0.016 inch to 0.0120 inch or 35% in thickness from 0.123 inch to 0.008 inch gauge and aged at 450° C. for 2 hours for the 25% cold roll reduction or 435° C. for 3 hours for the 35% cold roll reduction. The mechanical properties at finish gauge are listed in Table 9.

TABLE 9

| Alloy | Solution Anneal | Yield Strength (ksi) | Ultimate Tensile Strength (ksi) | % Elongation | % IACS |
|---|---|---|---|---|---|
| J395 (0.008 inch thick and 35% cold roll and age) | 800° C./60 sec | 107 | 113 | 9 | 39.7 |
| | 840° C./60 sec | 110 | 117 | 6 | 36.8 |
| | 880° C./60 sec | 110 | 117 | 4 | 36.9 |
| J394 (0.008 inch thick and 35% cold roll and age) | 800° C./60 sec | 84 | 88 | 6 | 47.6 |
| | 840° C./60 sec | 85 | 90 | 6 | 45.0 |
| | 880° C./60 sec | 88 | 94 | 6 | 41.7 |
| J401 (0.008 inch thick and 35% cold roll and age) | 800° C./60 sec | 93 | 98 | 8 | 43.0 |
| | 840° C./60 sec | 94 | 99 | 8 | 41.6 |
| | 880° C./60 sec | 98 | 104 | 7 | 39.9 |
| RN503014 (0.012 inch thick and 25% cold roll and age) | 950° C./60 sec | 101 | 107 | 3 | 35.6 |
| J719 (0.012 inch thick and 25% cold roll and age) | 950° C./60 sec | 92 | 97 | 6 | 43.7 |

Milled plate of the same alloys was cold rolled to 0.0160 inch and solutionized at temperatures between 850° and 975° C. for 60 seconds followed by a water quench. In accordance with the process of the invention, without any intervening cold work, the alloys were first aged at 525° C. for 3 hours, cold rolled to a thickness reduction of 25% to 0.0120 inch gauge and second aged at 400° C. for 3 hours. The mechanical properties at finish gauge are reported in Table 10.

TABLE 10

| Alloy | Solution Anneal | Yield Strength (ksi) | Ultimate Tensile Strength (ksi) | % Elongation | % IACS |
|---|---|---|---|---|---|
| J395 (No Co) | 850° C./60 sec | 101 | 110 | 7 | 46.1 |
| | 950° C./60 sec | 102 | 110 | 7 | 46.5 |
| J394 | 850° C./60 sec | 93 | 98 | 6 | 50.3 |
| | 950° C./60 sec | 108 | 113 | 5 | 46.9 |
| J401 | 850° C./60 sec | 99 | 104 | 4 | 49.2 |
| | 950° C./60 sec | 117 | 122 | 5 | 45.7 |
| RN503014 (0.012 inch thick) | 925° C./60 sec | 103 | 108 | 6 | 49.8 |
| | 950° C./60 sec | 111 | 116 | 5 | 48.8 |
| | 975° C./60 sec | 120 | 126 | 6 | 46.1 |
| J719 (No Ni) | 900° C./60 sec | 96 | 100 | 6 | 55.4 |
| | 950° C./60 sec | 106 | 110 | 5 | 52.7 |

A comparison of data in Table 9 to that in Table 10 proves that the process of the invention, using two aging anneals with the first aging anneal following solutionizing without intervening cold work, significantly increases electrical conductivity. For alloys containing cobalt, this increase in electrical conductivity is combined with an increase in strength.

Example 8

This example also illustrates that cobalt-containing alloys with both higher strengths and higher electrical conductivities are obtained using the process of the invention. Milled plates of the alloys listed in Table 11 were cold rolled to 0.016 inch and solutionized at either 850° or 950° C. for 60 seconds followed by a water quench. These alloys were first aged at 525° C. for 3 hours and then cold rolled to a thickness reduction of either 15% or 25% to 0.0136 inch or 0.0120 inch gauge. Following cold rolling, the alloys were second aged at either 400° C. for 3 hours or 450° C. for 3 hours. The mechanical properties at finish gauge are reported in Table 10 and demonstrate that the yield strength of the alloys is increased by about 20-30 ksi if the solutionized and first aged (525° C./3 Hrs) strip is cold rolled 25%, and then second aged at 400-450° C. for 3-6 hours. The alloys with the cobalt additions show significantly higher yield strengths than the alloy without cobalt, J395, an unexpected finding.

TABLE 11

| Alloy | Solutionize Temperature (° C.) | % Cold Roll Reduction | Temperature (° C.) | Yield Strength (ksi) After 1$^{st}$ Age | Yield Strength (ksi) After 2$^{nd}$ Age | Electrical Conductivity (% IACS) After 1$^{st}$ Age | Electrical Conductivity (% IACS) After 2$^{nd}$ Age |
|---|---|---|---|---|---|---|---|
| J395 | 850° C. | 15% | 450° C. | 83.4 | 91.8 | 40.8 | 48.3 |
| 0 cobalt | | 25% | 400° C. | 83.4 | 95.5 | 40.8 | 46.2 |
|  | 950° C. | 15% | 450° C. | 87.6 | 95.6 | 40.9 | 50.0 |
|  |  | 25% | 400° C. | 87.6 | 98.4 | 40.9 | 45.8 |
| J398 | 850° C. | 15% | 450° C. | 78.4 | 98.0 | 43.8 | 48.7 |
|  |  | 25% | 400° C. | 78.4 | 102.7 | 43.8 | 47.0 |
| 0.52 cobalt | 950° C. | 15% | 450° C. | 90.6 | 108.6 | 40.0 | 43.9 |
|  |  | 25% | 400° C. | 90.6 | 112.4 | 40.0 | 43.4 |
| J394 | 850° C. | 15% | 450° C. | 64.8 | 90.7 | 47.2 | 52.8 |
|  |  | 25% | 400° C. | 64.8 | 95.1 | 47.2 | 51.1 |
| 0.89 cobalt | 950° C. | 15% | 450° C. | 78.9 | 101.4 | 43.2 | 48.4 |
|  |  | 25% | 450° C. | 78.9 | 102.7 | 43.2 | 47.4 |
| J623 | 850° C. | 15% | 450° C. | 65.9 | 88.4 | 46.1 | 50.1 |
|  |  | 25% | 400° C. | 65.9 | 94.0 | 46.1 | 48.8 |
| 1.06 cobalt | 950° C. | 15% | 450° C. | 79.1 | 103.2 | 42.5 | 45.1 |
|  |  | 25% | 400° C. | 79.1 | 109.8 | 42.5 | 45.4 |
| J401 | 850° C. | 15% | 450° C. | 71.1 | 93.4 | 44.1 | 51.0 |
|  |  | 25% | 400° C. | 71.1 | 96.5 | 44.1 | 47.9 |
| 1.06 cobalt | 950° C. | 15% | 450° C. | 87.5 | 108.7 | 40.4 | 46.5 |
|  |  | 25% | 400° C. | 87.5 | 112.8 | 40.4 | 44.6 |
| J624 | 850° C. | 15% | 450° C. | 71.8 | 92.4 | 44.2 | 47.4 |
|  |  | 25% | 400° C. | 71.8 | 98.5 | 44.2 | 46.8 |
| 1.59 cobalt | 950° C. | 15% | 450° C. | 85.1 | 110.0 | 39.7 | 42.0 |
|  |  | 25% | 400° C. | 85.1 | 113.7 | 39.7 | 42.0 |
| J620 | 850° C. | 15% | 450° C. | 75.9 | 95.2 | 45.5 | 48.8 |
|  |  | 25% | 400° C. | 75.9 | 101.1 | 45.5 | 48.3 |
| 2.26 cobalt | 950° C. | 15% | 450° C. | 93.9 | 114.2 | 40.4 | 44.3 |
|  |  | 25% | 400° C. | 93.9 | 119.6 | 40.4 | 43.5 |

Example 9

This example illustrates that the process of the invention results in copper alloys with a higher combination of yield strength and electrical conductivity when compared to a number of prior art processes. The example further illustrates that the highest combination of properties is achieved when the temperature of the second age anneal is less than the temperature of the first age anneal.

Figure 6:
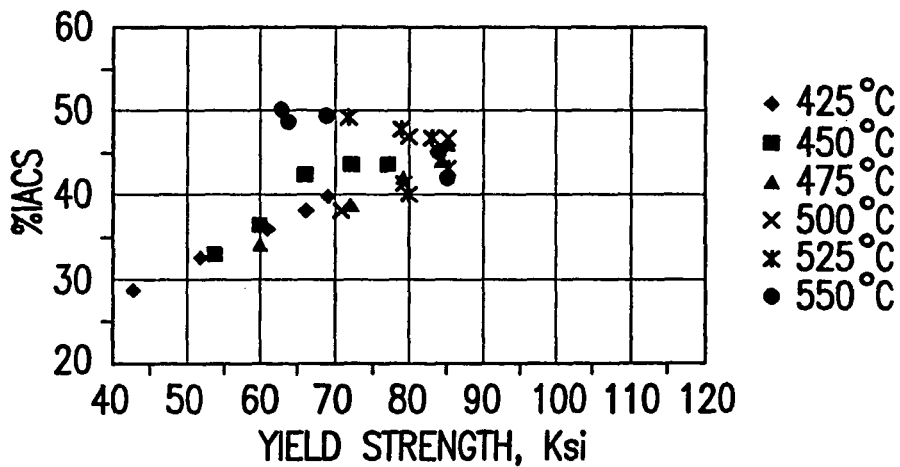
FIG. 6 illustrates the effect of age temperature on the combination of electrical conductivity and yield strength of the copper alloys of the invention processed according to a first prior art process.
Figure 7:
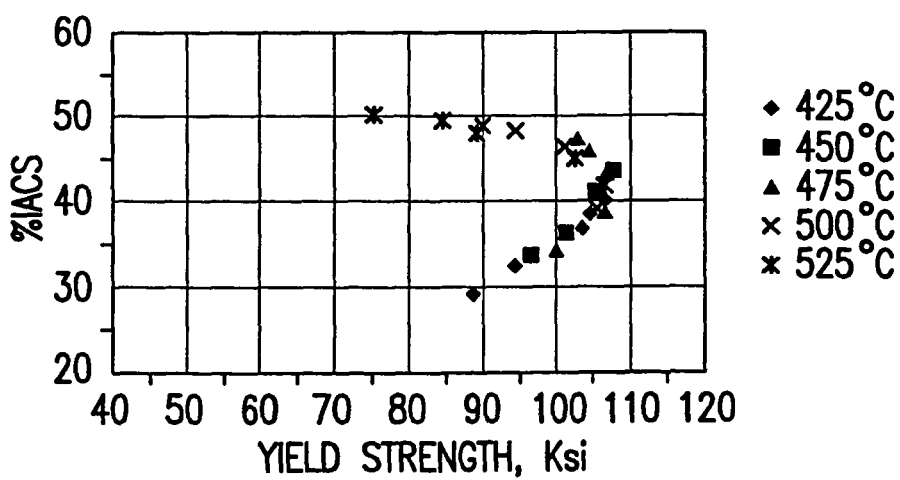
FIG. 7 illustrates the effect of age temperature on the combination of electrical conductivity and yield strength of the copper alloys of the invention processed according to a second prior art process.
Figure 8:
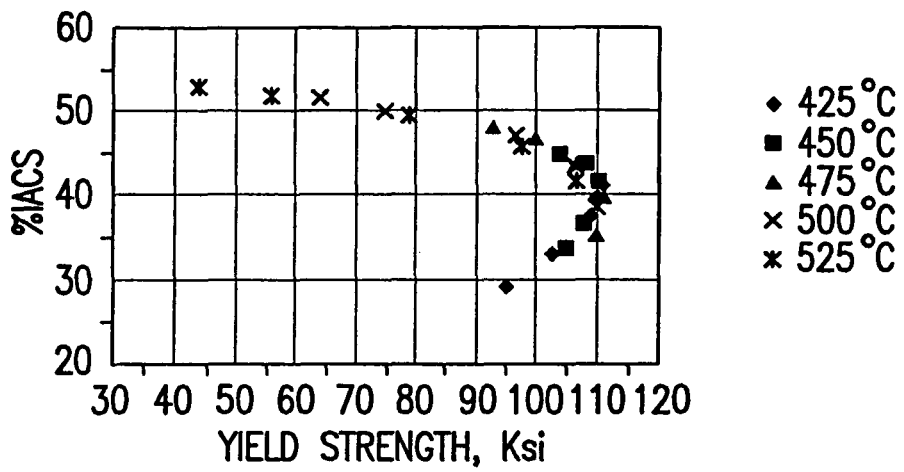
FIG. 8 illustrates the effect of age temperature on the combination of electrical conductivity and yield strength of the copper alloys of the invention processed according to a third prior art process.
Figure 9:
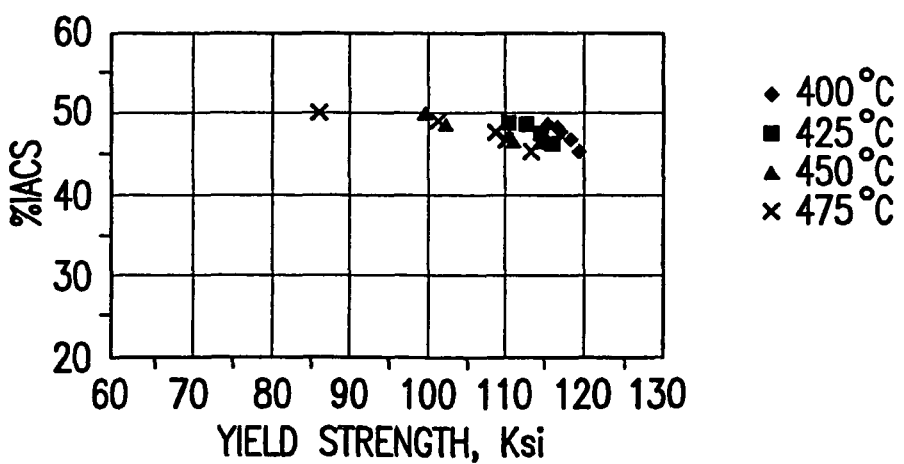
FIG. 9 illustrates the effect of second age temperature on the combination of electrical conductivity and yield strength of the copper alloys of the invention processed according to a process of the invention.

Milled plate of alloy RN503014 was cold rolled to 0.016 inch and solutionized at 950° C. for 60 seconds followed by a water quench. This solutionized strip was then processed according to the process sequences delineated in Table 12. Process 4 is the process of the invention. The effect of age temperature on yield strength and electrical conductivity for Process 1 is illustrated in FIG. 6. The effect of age temperature on yield strength and electrical conductivity for Process 2 is illustrated in FIG. 7. The effect of age temperature on yield strength and electrical conductivity for Process 3 is illustrated in FIG. 8. The first age temperature for Process 4 was 525° C. for 3 hours. The effect of second age temperature on yield strength and electrical conductivity for Process 1 is illustrated in FIG. 9.

TABLE 12

| Process 1 | Process 2 | Process 3 | Process 4 |
|---|---|---|---|
| Age | Cold Roll 25% Age | Cold Roll 50% Age | First Age Cold Roll 25% Second Age |

Table 13 reports the conductivity at maximum yield strength and the yield strength at maximum conductivity for the alloy as processed by each of the four process paths. Only Process 4 achieves the highest combination of high yield strength and electrical conductivity.

TABLE 13

| | At Maximum Yield Strength | | At Maximum Conductivity | |
|---|---|---|---|---|
| Process | Yield Strength (ksi) | Conductivity (% IACS) | Yield Strength (ksi) | Conductivity (% IACS) |
| 1 | 85 | 45 | 72 | 49 |
| 2 | 107 | 42 | 84 | 49 |
| 3 | 110 | 41 | 79 | 50 |
| 4 | 120 | 45 | 110 | 50 |

FIG. 9 further illustrates that under the process of the invention with a first age temperature of about 525° C., the optimum combination of yield strength and electrical conductivity is achieved when the second age temperature is at a lower temperature and, preferably, the second age temperature is in the range of 400° C. and 450° C.

Example 10

This example illustrates that improved combinations of properties are obtained using the process of the invention as compared to either the high temperature or the low temperature process disclosed in U.S. Pat. No. 6,506,269. Milled plate of alloy J910 was cold rolled to 0.016 inch and solutionized at 925° C. for 60 seconds. The alloy was first age annealed at 500° C. for 8 hours, cold rolled 25% to 0.012 inch and second age annealed at 400° C. for 16 hours.

Milled plate of alloy J989 was divided into half (alloys J989-A and J989-B). Alloy J989-A was processed according to the high temperature process of U.S. Pat. No. 6,506,269, cold roll to 0.030 inch, solutionize 925° C. for 60 seconds, cold roll 60% to 0.012 inch and age anneal at 525° C. for 6 hours.

Alloy J989-B was processed according to the low temperature process of U.S. Pat. No. 6,506,269, cold roll to 0.12 inch, first age anneal at 400° C. for 6 hours, cold roll 60% to 0.048 inch, second age anneal at 400° C. for 6 hours, cold roll 75% to 0.012 inch and third age anneal at 430° C. for 6 hours.

Table 14 recites the measured properties of the alloys.

TABLE 14

| Process | Yield Strength (ksi) | Electrical Conductivity (% IACS) | MBR/t GW | MBR/t BW |
|---|---|---|---|---|
| J910 | 114.5 | 51.8 | | |
| J989-A | 94.4 | 45.5 | 2.2 | 3.9 |
| J989-B | 117.6 | 51.4 | 2.2 | 8.8 |

While the bend properties of J910 were not measured, based on data from similar alloys processed according to the invention an MBR/t for the good way is expected to be 2.2 and an MBR/t for the bad way is expected to be 2.5. This shows that the process of the invention results in a copper alloy having improved bends at a similar combination of yield strength and electrical conductivity when compared to a U.S. Pat. No. 6,506,269 process.

Example 11

This example illustrates that the electrical conductivity response at finish gauge is dependent on both first and second age treatments and that the electrical conductivity shows a larger increase and higher values after the second age anneal when the first age anneal is at 525° C.

Milled plate of alloy J648 was cold rolled to 0.016 inch and solution heat treated at temperatures from 950° C. for 60 seconds followed by a water quench. The alloy was then first aged for 3 hours at either 475° C. or at 525° C. for 3 hours. The mill plate was then cold rolled for a thickness reduction of 25% to 0.0120 inch and second aged at temperatures of from 400° C.-450° C. for either 3 or 6 hours.

As shown in Table 15, the electrical conductivity response at finish gauge is dependent on both first and second age treatments. These data also indicate the electrical conductivity shows a larger increase and higher values after the second age anneal when the first age anneal is at 525° C. This unexpected aging response enables the alloys to approach the desired combination of high strength and high conductivity.

TABLE 15

| | | | Finish Gauge Properties | | |
|---|---|---|---|---|---|
| First Age Temperature (° C.) | Second Age Temperature (° C.) | Second Age Time (hours) | Yield Strength (ksi) | Conductivity (% IACS) | Δ % IACS |
| 475 | None | None | 111.4 | 36.8 | — |
| 475 | 400 | 3 | 112.9 | 40.7 | 3.9 |
| 475 | 400 | 6 | 114.9 | 40.9 | 4.1 |
| 475 | 425 | 6 | 112.8 | 40.7 | 3.9 |
| 475 | 450 | 3 | 113.1 | 39.8 | 3.0 |
| 525 | None | None | 111.2 | 41.2 | — |
| 525 | 400 | 3 | 111.9 | 46.9 | 5.7 |
| 525 | 400 | 6 | 109.5 | 49.4 | 8.2 |
| 525 | 425 | 6 | 110.7 | 50.1 | 8.9 |
| 525 | 450 | 3 | 109.8 | 48.2 | 7.0 |

Example 12

This example illustrates that the electrical conductivity of copper alloy C7025 is increased by processing according to the current invention.

Milled plates of alloys J724 and J731 were cold rolled to 0.016 inch and solution heat treated at temperature of between 780° C. and 840° C. and then water quenched to provide a recrystallized strip. Without intervening cold work, the alloys were then age annealed at 525° C. for 3 hours, cold rolled to a finish gauge of 0.012 inch and aged at either 400° C. for 3 hours or 425° C. for 6 hours.

The mechanical properties at finish gauge are recited in Table 16. The combination of strength and bend properties is comparable to conventionally processed copper alloy C7025 which in a similar temper has a yield strength of between 95 and 100 ksi and an electrical conductivity between 40% and 45% IACS. The process of the invention achieved a conductivity exceeding that of conventionally processed C7025 without a loss of yield strength.

TABLE 16

| Ingot | Second Age Anneal | Yield Strength (ksi) | Tensile Strength (ksi) | Electrical Elongation (%) | Conductivity (% IACS) | 90° MBR/t GW | 90° MBR/t BW |
|---|---|---|---|---|---|---|---|
| J724 | 400° C./3 hours | 95.2 | 103.4 | 8 | 47.6 | — | — |
| J724 | 425° C./6 hours | 95.1 | 103.9 | 8 | 52.5 | 1.5 | 0.9 |
| J731 | 400° C./3 hours | 96.7 | 103.6 | 8 | 52.1 | — | — |
| J731 | 425° C./6 hours | 95.0 | 102.9 | 8 | 55.8 | 1.4 | 1.3 |

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A wrought copper alloy consisting essentially, by weight, of: from 1% to 2.5% of nickel; from 0.5% to 2.0% of cobalt, with a total nickel plus cobalt content of from 1.7% to 4.3% and a weight percent ratio of nickel to cobalt that is from 0.5:1 to 5:1; from 0.5% to 1.5% of silicon with the weight ratio of (Ni+Co)/Si being between 3.5:1 and 6:1; and the balance copper and inevitable impurities wherein said wrought copper alloy has an electrical conductivity in excess of 40% IACS, a yield strength in excess of 95 ksi, a minimum bend radius as a function of thickness, mbr/t of up to 4t for both good way and bad way bends and an average grain size of 20 microns or less following solutionizing at 950° C.

2. The wrought copper alloy of claim 1 wherein said nickel content is from 1.3% to 1.9%, said cobalt content is from 0.5% to 1.5% and said silicon content is from 0.5% to 0.8%.

3. The wrought copper alloy of claim 2 wherein a weight percent ratio of nickel to cobalt is from 1.01:1 to 1.5:1.

4. The wrought copper alloy of claim 3 wherein said wrought copper alloy has a yield strength of 100 ksi or greater.

5. A wrought copper alloy consisting essentially, by weight, of: from 1% to 2.5% of nickel; from 0.5% to 2.0% of cobalt, with a total nickel plus cobalt content of from 1.7% to 4.3% and a weight percent ratio of nickel to cobalt that is from 1.01:1 to 2.6:1; from 0.5% to 1.5% of silicon with the weight ratio of (Ni+Co)/Si being between 3.5:1 and 6:1; from an amount effective to improve a combination of yield strength and electrical conductivity up to 1.0% of silver, titanium, zirconium and combinations thereof; up to 0.15% of magnesium; and the balance copper and inevitable impurities wherein said wrought copper alloy has an electrical conductivity in excess of 40% IACS, a minimum bend radius as a function of thickness, mbr/t of up to 4 t for both good way and bad way bends and an average grain size of 20 microns or less following solutionizing at 950° C.

6. The wrought copper alloy of claim 5 wherein said silver content is from 0.2% to 0.7%.

7. The wrought copper alloy of claim 6 wherein the magnesium content is between 0.005% and 0.04%.

8. The wrought copper alloy of claim 5 wherein said nickel content is from 1.3% to 1.9%, said cobalt content is from 0.5% to 1.5% and said silicon content is from 0.5% to 0.8%.

9. The wrought copper alloy of claim 8 wherein a weight percent ratio of nickel to cobalt is from 1.01:1 to 1.5:1.

10. The wrought copper alloy of claim 9 wherein said wrought copper alloy has a yield strength of 100 ksi or greater.

* * * * *